United States Patent
Kiyosawa et al.

(10) Patent No.: US 9,170,036 B2
(45) Date of Patent: Oct. 27, 2015

(54) THERMOELECTRIC MODULE

(71) Applicant: KELK Ltd., Hiratsuka-shi, Kanagawa (JP)

(72) Inventors: Wataru Kiyosawa, Hiratsuka (JP); Shunsuke Kushibiki, Hiratsuka (JP)

(73) Assignee: KELK Ltd., Hiratsuka-shi, Kanagawa (JP)

( * ) Notice: Subject to any disclaimer, the term of this patent is extended or adjusted under 35 U.S.C. 154(b) by 157 days.

(21) Appl. No.: 14/095,381

(22) Filed: Dec. 3, 2013

(65) Prior Publication Data

US 2014/0150463 A1    Jun. 5, 2014

(30) Foreign Application Priority Data

Dec. 5, 2012    (JP) ................................ 2012-266182

(51) Int. Cl.
*F25B 21/02*    (2006.01)
*H01L 35/16*    (2006.01)
*H01L 35/32*    (2006.01)

(52) U.S. Cl.
CPC ................ *F25B 21/02* (2013.01); *H01L 35/16* (2013.01); *H01L 35/32* (2013.01)

(58) Field of Classification Search
CPC ......... F25B 21/00; F25B 21/02; H01L 35/16; H01L 38/32
USPC ....................................... 62/3.2, 3.7
See application file for complete search history.

(56) References Cited

U.S. PATENT DOCUMENTS

| | | | | | |
|---|---|---|---|---|---|
| 6,112,525 | A | * | 9/2000 | Yoshida et al. | 62/3.7 |
| 7,579,218 | B2 | * | 8/2009 | Popovich | 438/122 |
| 8,174,832 | B2 | * | 5/2012 | Yu et al. | 361/709 |
| 8,683,815 | B2 | * | 4/2014 | Muller et al. | 62/3.1 |
| 2001/0013224 | A1 | * | 8/2001 | Ohkubo et al. | 62/3.7 |
| 2007/0227158 | A1 | * | 10/2007 | Kuchimachi | 62/3.7 |
| 2009/0249796 | A1 | * | 10/2009 | Ullman | 62/3.7 |
| 2010/0018222 | A1 | * | 1/2010 | Tsuchida et al. | 62/3.7 |
| 2010/0186424 | A1 | * | 7/2010 | Horio | 62/3.7 |
| 2011/0016889 | A1 | * | 1/2011 | Albayrak et al. | 62/3.7 |
| 2011/0030389 | A1 | * | 2/2011 | Morisaku et al. | 62/3.7 |
| 2011/0132001 | A1 | * | 6/2011 | Lin et al. | 62/3.7 |
| 2012/0047912 | A1 | * | 3/2012 | Danenberg et al. | 62/3.7 |

FOREIGN PATENT DOCUMENTS

| | | |
|---|---|---|
| JP | 2000-101152 A | 4/2000 |
| JP | 2004-228230 A | 8/2004 |
| JP | 2007-48916 A | 2/2007 |

* cited by examiner

*Primary Examiner* — Mohammad M Ali
(74) *Attorney, Agent, or Firm* — Drinker Biddle & Reath LLP

(57) ABSTRACT

A thermoelectric module includes a thermoelectric element and an electrode. The thermoelectric element has a rectangular end face. The electrode includes a first joint portion joined to a center portion of the end face; and a second joint portion joined to one end and a third joint portion joined to the other end. Each of the second joint portion and the third joint portion is disposed at a distance from each of four corners of the end face. A joint length in the second direction orthogonal to the first direction between the first joint portion and the end face is longer than each of a joint length in the second direction between the second joint portion and the end face, and a joint length in the second direction between the third joint portion and the end face.

6 Claims, 7 Drawing Sheets

THERMOELECTRIC MODULE

BACKGROUND OF THE INVENTION

1. Field of the Invention

The present invention relates to a thermoelectric module, and particularly to a thermoelectric module including a thermoelectric element and an electrode.

2. Description of the Background Art

Generally, a thermoelectric module is configured such that an electrode is joined to an end face of a thermoelectric element. Such a thermoelectric module is disclosed, for example, in Japanese Patent Laying-Open No. 2000-101152.

In the thermoelectric module disclosed in the above-mentioned patent document, however, since the electrode is joined to a part of the end face of the thermoelectric element, the area of the electrode joined to the end face of the thermoelectric element becomes relatively small. This poses a problem of decreasing the effect of heat transfer between an object and the thermoelectric element. In order to improve the effect of heat transfer between the object and the thermoelectric element, it is conceivable to join the electrode to the entire end face of the thermoelectric element.

This however also causes the following problem. Specifically, when a current is caused to flow through the thermoelectric module, one end face of the thermoelectric element is cooled while the other end face opposite to one end face is heated. In this case, since a temperature difference occurs in the thermoelectric element between one end face and the other end face, unbalanced deformation tends to occur in one end face and the other end face of the thermoelectric element in accordance with the thermal expansion coefficient thereof. However, since electrodes are joined to one end face and the other end face, respectively, of the thermoelectric element, deformation of the thermoelectric element is prevented by these electrodes. Consequently, thermal stress occurs in the thermoelectric element. Since this thermal stress is noticeably concentrated in four corners of the end face of the thermoelectric element, these four corners of the end face of the thermoelectric element may be destroyed by the thermal stress.

SUMMARY OF THE INVENTION

The present invention has been made in light of the above-described problems. An object of the present invention is to provide a thermoelectric module by which concentration of thermal stress in four corners of the end face of the thermoelectric element can be prevented, and the area of the electrode joined to the end face of the thermoelectric element can be enlarged.

The thermoelectric module according to the present invention includes a thermoelectric element and an electrode. The thermoelectric element has a rectangular end face. The electrode is joined to the end face to be electrically connected to the thermoelectric element. The electrode includes a first joint portion joined to a center portion of the end face in a first direction in which opposite sides of the end face face each other; and a second joint portion joined to one end of the end face across the center portion in the first direction and a third joint portion joined to the other end of the end face. Each of the second joint portion and the third joint portion is disposed at a distance from each of four corners of the end face. A joint length in a second direction orthogonal to the first direction between the first joint portion and the end face is longer than each of a joint length in the second direction between the second joint portion and the end face, and a joint length in the second direction between the third joint portion and the end face.

According to the thermoelectric module of the present invention, each of the second joint portion and the third joint portion is disposed at a distance from each of the four corners of the end face. Accordingly, the electrode is not joined to the four corners of the end face of the thermoelectric element. Thereby, concentration of the thermal stress in the four corners of the end face of the thermoelectric element can be prevented. Furthermore, the joint length in the second direction between the first joint portion and the end face is longer than each of the joint length in the second direction between the second joint portion and the end face, and the joint length in the second direction between the third joint portion and the end face. Accordingly, the area of the electrode joined to the end face of the thermoelectric element can be enlarged as compared with the case where the joint length between the first joint portion and the end face is equal to each of the joint length between the second joint portion and the end face, and the joint length between the third joint portion and the end face.

According to the above-described thermoelectric module, a length of a portion including the first joint portion of the electrode in the second direction is equal to or longer than a length of the end face of the thermoelectric element in the second direction. Accordingly, the joint length between the first joint portion and the end face is equal to the length of the end face of the thermoelectric element in the second direction. Therefore, the joint length between the first joint portion and the end face can be maximized, with the result that the area of the electrode connected to the end face of the thermoelectric element can be enlarged.

According to the above-described thermoelectric module, the electrode includes a plate-shaped portion and a protrusion protruding from the plate-shaped portion in a thickness direction of the plate-shaped portion. The protrusion is joined to the end face of the thermoelectric element. Accordingly, the thermal stress generated in the thermoelectric element can be released to the protrusion of the electrode. Furthermore, even if the thermal stress is concentrated in the protrusion, the durability of the thermoelectric module can be improved because the electrode is greater in mechanical strength than the thermoelectric element.

According to the above-described thermoelectric module, the plate-shaped portion and the protrusion of the electrode are integrally formed. Accordingly, since the mechanical strength of the electrode can be improved, the durability of the thermoelectric module can be further improved.

According to the above-described thermoelectric module, the thermoelectric module further includes a base film formed of polyimide and joined to the electrode. The electrode includes one face and the other face facing each other. One face is joined to the end face of the thermoelectric element, and the other face is joined to the base film. Accordingly, the thermal stress can be released to the base film formed of polyimide. Polyimide readily deforms, so that the thermal stress can be readily released. Therefore, the durability of the thermoelectric module can be improved.

According to the above-described thermoelectric module, the thermoelectric element has one side configured as a heat-absorption side and the other side configured as a heat-dissipation side. The electrode is disposed on the heat-absorption side of the thermoelectric element. In the thermoelectric module, the heat-absorption side generally serves to regulate the temperature of an object, and undergoes a relatively large temperature change as compared with the heat dissipation side. Consequently, the operating condition is stricter on the heat-absorption side than on the heat-dissipation side. Accordingly, it is required to prevent concentration of the thermal stress on the heat-absorption side. Since the electrode is disposed on the heat-absorption side of the thermoelectric element, concentration of the thermal stress can be prevented on the heat-absorption side. Therefore, the durability of the thermoelectric module can be effectively improved.

As described above, according to the present invention, concentration of the thermal stress in the four corners of the end face of the thermoelectric element can be prevented while the area of the electrode joined to the end face of the thermoelectric element can be enlarged.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be hereinafter described with reference to the accompanying drawings.

First Embodiment

The configuration of a thermoelectric module in the first embodiment of the present invention will be first hereinafter described.

Figure 1:
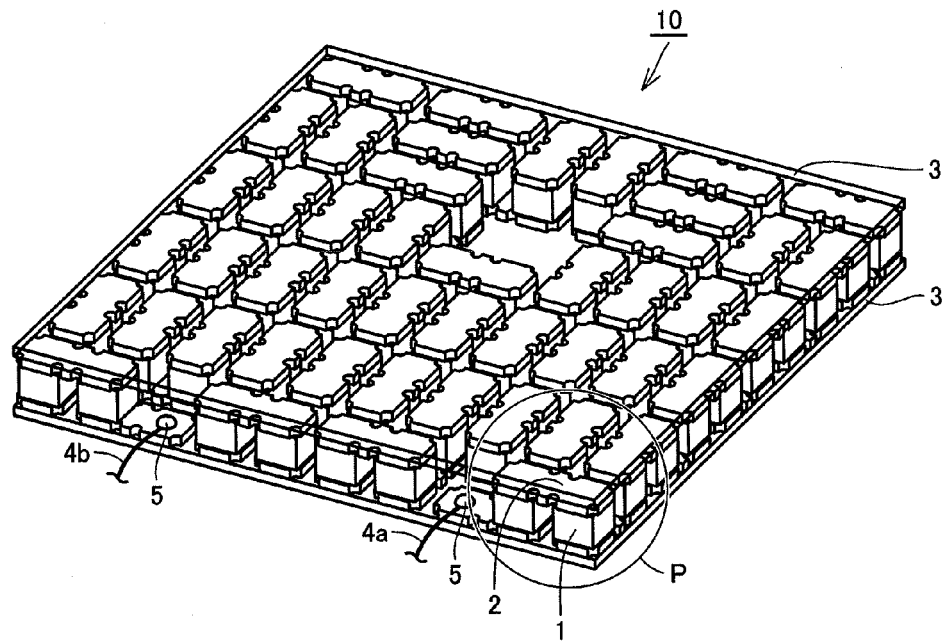
FIG. 1 is a perspective view schematically showing the configuration of a thermoelectric module in the first embodiment of the present invention.

Referring to FIG. 1, a thermoelectric module 10 according to the present embodiment mainly includes a plurality of thermoelectric elements 1, a plurality of electrodes 2, a pair of base films 3, a first lead wire 4a, a second lead wire 4b, and solder 5.

Thermoelectric module 10 is configured such that the plurality of thermoelectric elements 1 are jointed between the pair of base films 3 so as to be electrically connected in series in an alternate manner by a plurality of electrodes 2. A pair of thermoelectric elements 1 are joined to each electrode 2 other than two electrodes 2 to which first lead wire 4a and second lead wire 4b are joined.

First lead wire 4a and second lead wire 4b are attached to two electrodes 2, respectively, with solder 5. Thereby, first lead wire 4a and second lead wire 4b are electrically connected to two electrodes 2, respectively. It is to be noted that only one thermoelectric element 1 is mounted on each of these two electrodes 2.

Figure 2:
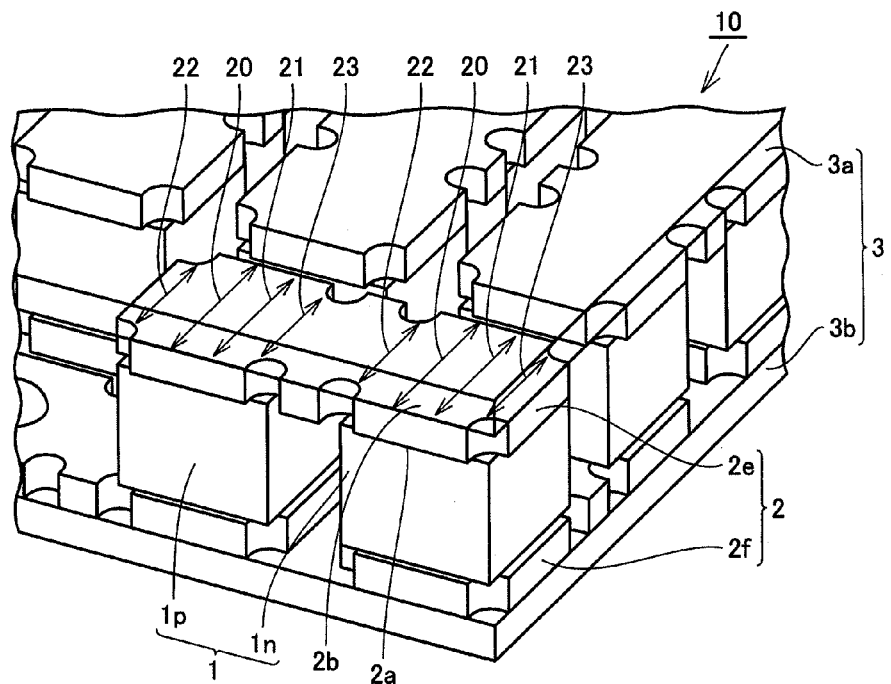
FIG. 2 is an enlarged view of a portion P in FIG. 1.
Figure 3:
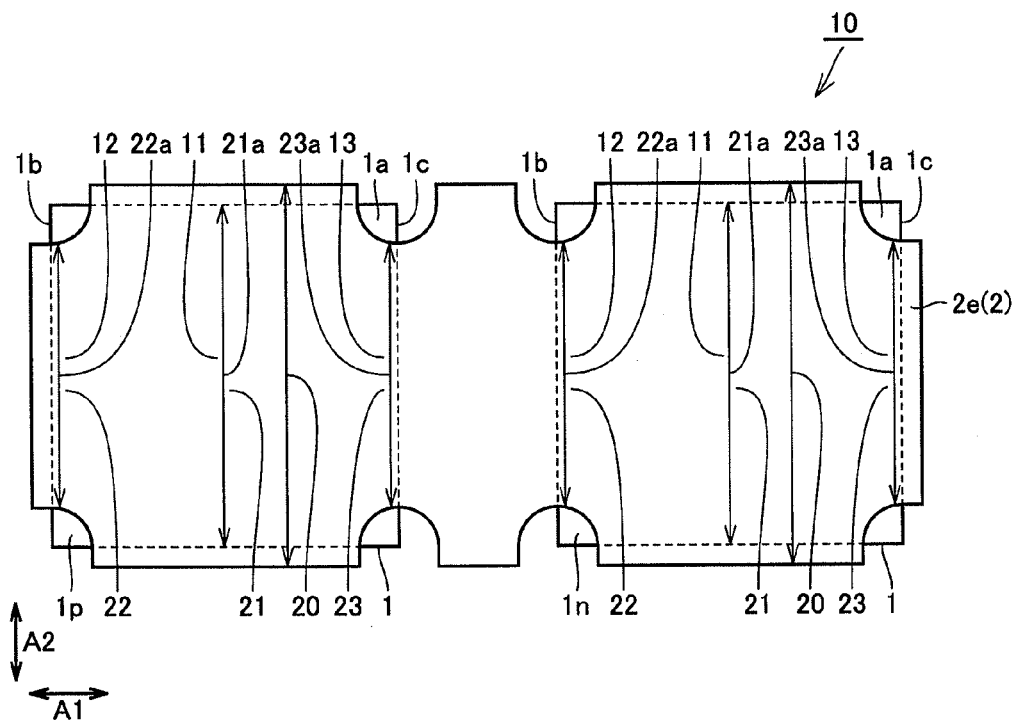
FIG. 3 is a top plan view schematically showing the configuration of one electrode and two thermoelectric elements joined to the electrode in the thermoelectric module in FIG. 2.

Referring to FIGS. 2 and 3, each of thermoelectric elements 1 has a rectangular parallelepiped shape. Each of thermoelectric elements 1 has a rectangular end face 1a. End face 1a has a side 1b and a side 1c facing each other. Furthermore, end face 1a has a center portion 11, and one end 12 and the other end 13 that are located across center portion 11.

Thermoelectric elements 1 have p-type thermoelectric elements 1p and n-type thermoelectric elements 1n. P-type thermoelectric element 1p and n-type thermoelectric element 1n can be made of a material such as BiTe (bismuth tellurium)-based material, for example.

Each of electrodes 2 is joined to end face 1a, thereby being electrically connected to thermoelectric element 1. Electrode 2 is formed in a plate shape and has a cutout portion in each of its four corners. Electrode 2 also has a plurality of cutout portions in its center portion in the longitudinal direction. These cutout portions are arc-shaped. Furthermore, these cutout portions are formed so as to be located on the four corners of end face 1a of thermoelectric element 1 in the state where these cutout portions are joined to end face 1a of thermoelectric element 1. Electrode 2 can be made of Cu (copper), for example. Furthermore, the surface of electrode 2 may be covered by Ni (nickel), Au (gold) or the like.

In the present embodiment, one electrode 2 has two first joint portions 21 to two third joint portions 23. First joint portion 21 is joined to center portion 11 of end face 1a in a first direction A1 in which opposite sides 1b and 1c of end face 1a face each other. Second joint portion 22 and third joint portion 23 are joined to one end 12 and the other end 13, respectively, of end face 1a across center portion 11 in first direction A1. Center portion 11 only has to be located between one end 12 and the other end 13 in first direction A1, but is not necessarily located in the center of end face 1a in first direction A1. Second joint portion 22 and third joint portion 23 are disposed so as to face each other across first joint portion 21. Second joint portion 22 may be provided so as to extend along side 1b. Third joint portion 23 may be provided so as to extend along side 1c.

Each of second joint portion 22 and third joint portion 23 is located at a distance from each of four corners of end face 1a. These four corners of end face 1a are located so as to be exposed from electrode 2. A joint length 21a in a second direction A2 orthogonal to first direction A1 between first joint portion 21 and end face 1a is longer than each of a joint length 22a in the second direction between second joint portion 22 and end face 1a, and a joint length 23a in the second direction between third joint portion 23 and end face 1a. Furthermore, a length 20 of a portion including first joint portion 21 of electrode 2 in second direction A2 is equal to or longer than the length of end face 1a of thermoelectric element 1 in second direction A2.

A plurality of electrodes 2 have a plurality of heat-absorption side electrodes 2e and a plurality of heat-dissipation side electrodes 2f. One heat-absorption side electrode 2e has one face 2a to which one p-type thermoelectric element 1p and one n-type thermoelectric element 1n are joined. Different heat-dissipation side electrodes 2f are joined to this pair of p-type thermoelectric element 1p and n-type thermoelectric element 1n, respectively. Also, heat-absorption side electrode 2e and heat-dissipation side electrode 2f are displaced with respect to each other. Accordingly, pairs of p-type thermoelectric elements 1p and n-type thermoelectric elements 1n are electrically connected in series between heat-absorption side electrode 2e and heat-dissipation side electrode 2f, such that p-type thermoelectric elements 1p and n-type thermoelectric elements 1n are alternately arranged.

Electrode 2 has one face 2a and the other face 2b facing each other. One face 2a is joined to end face 1a of thermoelectric element 1. The other face 2b is joined to base film 3. Base film 3 is formed of polyimide. Base film 3 is transparently formed. Base film 3 is joined to a plurality of electrodes 2. A pair of base films 3 includes a heat-absorption side base film 3a and a heat-dissipation side base film 3b. Heat-absorption side base film 3a is joined to heat-absorption side electrode 2e while heat-dissipation side base film 3b is joined to heat-dissipation side electrode 2f.

Figure 4:
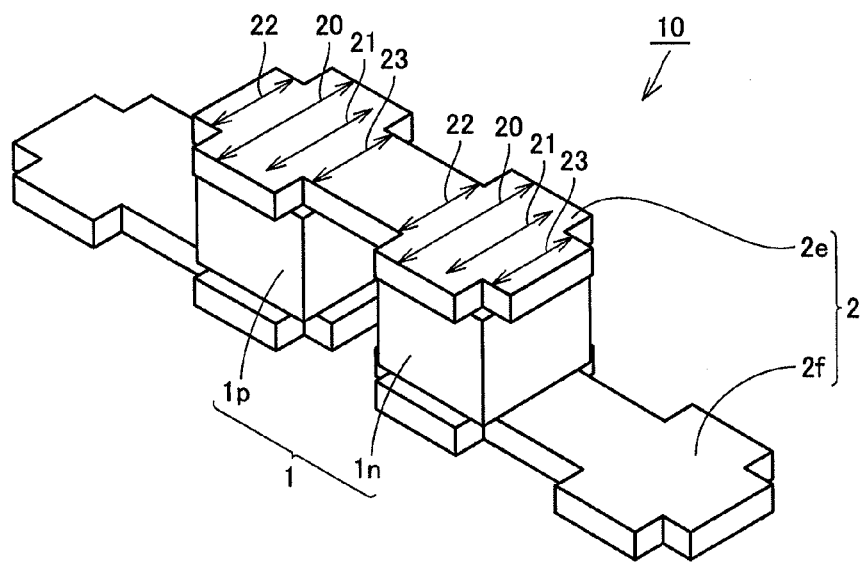
FIG. 4 is a perspective view schematically showing the configuration of the first modification of the thermoelectric module in the first embodiment of the present invention.

Then, the first modification of thermoelectric module 10 in the present embodiment will be described with reference to FIG. 4. In the first modification of thermoelectric module 10 in the present embodiment, electrode 2 has a cutout portion that is linearly formed. Furthermore, a plurality of cutout portions formed in the center of electrode 2 are continuously provided. Also in this first modification, each of second joint portion 22 and third joint portion 23 is joined to end face 1a at a distance, by the cutout portions, from the four corners of end face 1a. Also, joint length 21a (not shown) is longer than each of joint length 22a and joint length 23a.

Figure 5:
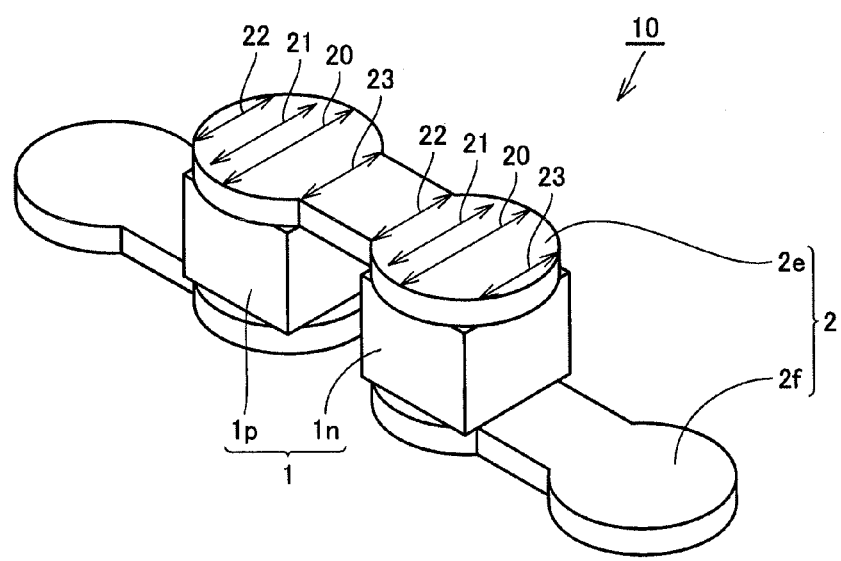
FIG. 5 is a perspective view schematically showing the configuration of the second modification of the thermoelectric module in the first embodiment of the present invention.

Furthermore, the second modification of thermoelectric module 10 in the present embodiment will be hereinafter described with reference to FIG. 5. In the second modification of thermoelectric module 10 in the present embodiment, the outer circumferential surface of each end of electrode 2 is formed in an arc-like shape. The outer circumferential surface of electrode 2 is not located on the four corners of end face 1a of thermoelectric element 1. Accordingly, each of second joint portion 22 and third joint portion 23 is arranged at a distance from each of the four corners of end face 1a. Furthermore, joint length 21a (not shown) is longer than each of joint length 22a and joint length 23a.

Figure 6:
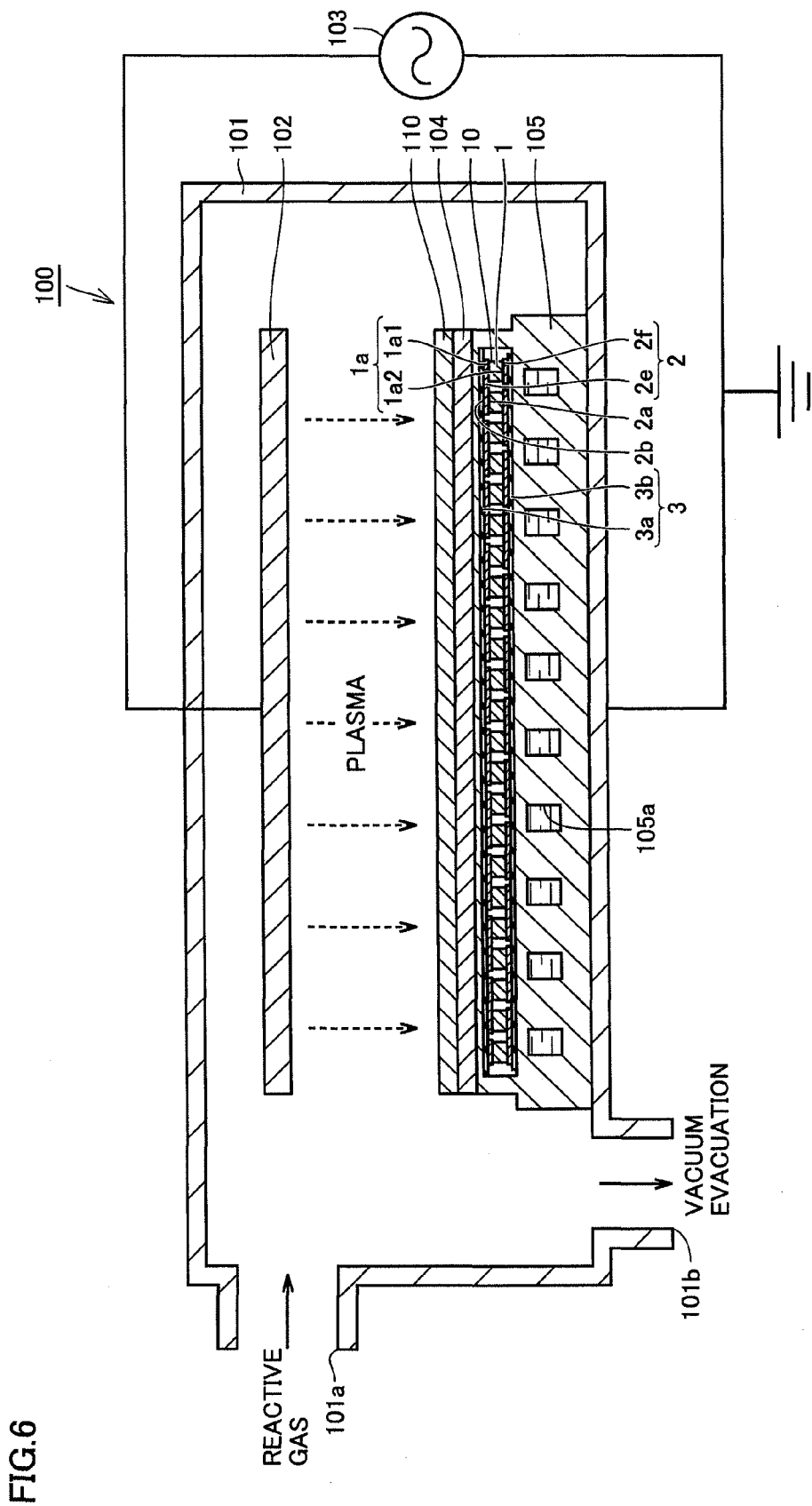
FIG. 6 is a cross-sectional view schematically showing the configuration of a plasma processing apparatus in the first embodiment of the present invention.

Referring to FIG. 6, a description will be made regarding a plasma processing apparatus 100 on which thermoelectric module 10 of the present embodiment is mounted. Plasma processing apparatus 100 mainly includes a thermoelectric module 10, a chamber 101, an electrode 102, a high-frequency oscillator 103, an electrostatic chuck 104, and a water cooling plate 105. In FIG. 6, a silicon wafer 110 is adsorbed onto electrostatic chuck 104.

Within chamber 101, electrode 102 is disposed so as to face silicon wafer 110. adsorbed onto electrostatic chuck 104. Electrostatic chuck 104 is configured such that it can adsorb silicon wafer 110. Thermoelectric module 10 and water cooling plate 105 are disposed below electrostatic chuck 104. Water cooling plate 105 is configured to allow a coolant to circulate through a pipe unit 105a. Heat-absorption side base film 3a and heat-absorption side electrode 2e of thermoelectric module 10 are arranged on the electrostatic chuck 104 side while heat-dissipation side base film 3b and heat-dissipation side electrode 2f are arranged on the water cooling plate 105 side.

Thermoelectric element 1 has one side configured as a heat-absorption side and the other side configured as a heat-dissipation side. Thermoelectric element 1 is provided on one side with one end face 1a1 and on the other side with the other end face 1a2. In other words, one end face 1a1 is disposed on the heat-absorption side while the other end face 1a2 is disposed on the heat-dissipation side. In the present embodiment, heat-absorption side electrode 2e is joined to one end face 1a1 while heat-dissipation side electrode 2f is joined to the other end face 1a2. Electrode 2 only has to be disposed at least on the heat-absorption side of thermoelectric element 1.

In plasma processing apparatus 100, silicon wafer 110 is adsorbed onto electrostatic chuck 104. After reactive gas for plasma generation is introduced into chamber 101 through an inlet 101a of chamber 101, high-frequency oscillator 103 applies a high-frequency wave to electrode 102, thereby generating plasma. By this plasma, silicon wafer 110 is subjected to a process such as etching. Then, the reactive gas used for generating plasma is removed through an outlet 101b by vacuum evacuation.

When silicon wafer 110 is subjected to a process such as etching by this plasma, the temperature of silicon wafer 110 needs to be controlled at a target temperature in order to improve the yield of silicon wafer 110. In plasma processing apparatus 100 in the present embodiment, a current is caused to flow through thermoelectric module 10, which causes a heat absorption phenomenon to occur in heat-absorption side electrode 2e and a heat dissipation phenomenon to occur in heat-dissipation side electrode 2f. Specifically, heat-absorption side electrode 2e is cooled while heat-dissipation side electrode 2f is heated. Accordingly, silicon wafer 110 is cooled by heat-absorption side base film 3a and heat-absorption side electrode 2e with electrostatic chuck 104 interposed between silicon wafer 110 and each of heat-absorption side base film 3a and heat-absorption side electrode 2e. In this way, the temperature of silicon wafer 110 is controlled at a target temperature. On the other hand, thermoelectric element 1 is cooled by water cooling plate 105 with heat-dissipation side base film 3b and heat-dissipation side electrode 2f interposed therebetween.

Figure 7:
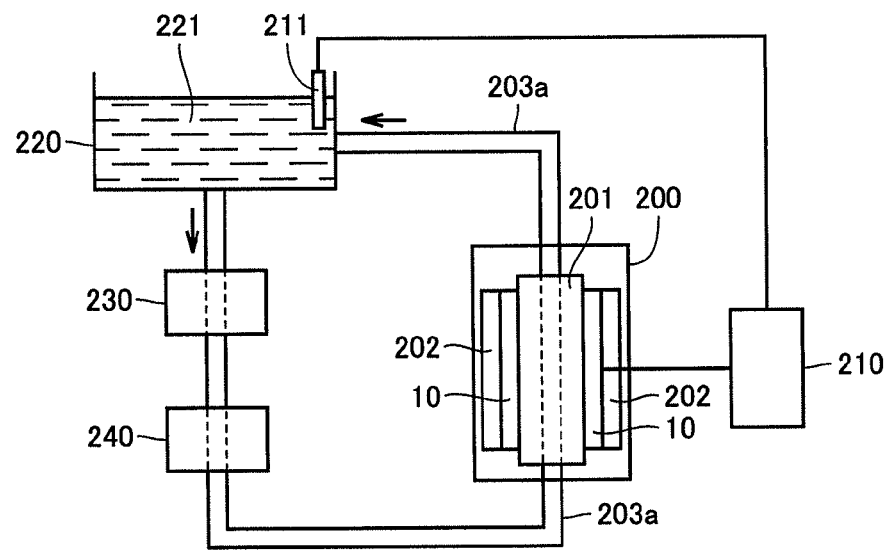
FIG. 7 is a diagram schematically showing the configuration of a chemical circulator and the like in the first embodiment of the present invention.

Then, referring to FIG. 7, a description will be made regarding a chemical circulator (a fluid temperature regulation apparatus) 200 on which thermoelectric module 10 of the present embodiment is mounted.

Chemical circulator 200 mainly includes a thermoelectric module 10, a main body 201 and a water cooling plate 202. Thermoelectric modules 10 are arranged so as to have main body 201 interposed therebetween, and water cooling plates 202 are arranged so as to have thermoelectric modules 10 interposed therebetween. Main body 201 is formed so as to allow the temperature-regulated fluid to circulate therethrough. Water cooling plate 202 is configured so as to allow water to circulate therethrough by a pipe unit (not shown).

A control unit 210 is electrically connected to thermoelectric module 10 of chemical circulator 200. A temperature sensor 211 is connected to control unit 210. Temperature sensor 211 is immersed in a chemical solution 221 (a temperature-regulated fluid) such that it can measure the temperature of chemical solution 221 stored in a processing bath 220.

A pipe line 203a is connected to processing tub 220 so as to allow circulation of chemical solution 221. A pump 230 is connected to processing tub 220 for circulating chemical solution 221 through pipe line 203a. A filter 240 is disposed between pump 230 and chemical circulator 200 through pipe line 203a. Pipe line 203a is connected to main body 201 of chemical circulator 200.

Chemical solution 221 circulates through pipe line 203a with pump 230 in the direction indicated by an arrow in the figure. In this case, the temperature of chemical solution 221 is controlled at a target temperature by chemical circulator 200. In other words, in chemical circulator 200 of the present embodiment, a current is caused to flow through thermoelectric module 10, thereby cooling the main body 201 side of thermoelectric module 10 while heating the water cooling plate 202 side thereof. In this way, the temperature of chemical solution 221 flowing through main body 201 is controlled at the target temperature. Also, thermoelectric element I is cooled by water cooling plate 202.

Although the above description is about the case where base film 3 formed of polyimide is used, the present invention is not limited thereto, but electrode 2 may be joined to the substrate. In this case, the substrate may be made of $Al_2O_3$ (aluminum oxide), AlN (aluminum nitride), SiC (silicon carbide), $Si_3N_4$ (silicon nitride), and the like.

Then, the functions and effects of the present embodiment will be described.

According to thermoelectric module 10 in the present embodiment, each of second joint portion 22 and third joint portion 23 is disposed at a distance from each of the four corners of end face 1a. Accordingly, electrode 2 is not joined to the four corners of end face 1a of thermoelectric element 1, with the result that concentration of thermal stress in the four corners of end face 1a of thermoelectric element 1 can be prevented. Furthermore, joint length 21a in second direction A2 between first joint portion 21 and end face 1a is longer than each of joint length 22a in second direction A2 between second joint portion 22 and end face 1a, and joint length 23a in second direction A2 between third joint portion 23 and end face 1a. Accordingly, the area of electrode 2 joined to end face 1a of thermoelectric element 1 can be enlarged, as compared with the case where joint length 21a between first joint portion 21 and end face 1a is equal to each of joint length 22a between second joint portion 22 and end face 1a, and joint length 23a between third joint portion 23 and end face 1a.

According to thermoelectric module 10 of the present embodiment, length 20 of a portion including first joint portion 21 of electrode 2 in second direction A2 is equal to or longer than the length of end face 1a of thermoelectric element 1 in second direction A2. Accordingly, joint length 21a between first joint portion 21 and end face 1a is equal to the length of end face 1a of thermoelectric element 1 in second direction A2. Therefore, joint length 21a between first joint portion 21 and end face 1a can be maximized. Consequently, the area of electrode 2 connected to end face 1a of thermoelectric element 1 can be enlarged.

According to thermoelectric module 10 in the present embodiment, one face 2a of electrode 2 is joined to end face 1a of thermoelectric element 1 while the other face 2b is joined to base film 3 formed of polyimide. Accordingly, the thermal stress can be released to base film 3 formed of polyimide. Since polyimide readily deforms, it is less likely to generate thermal stress on thermoelectric element 1. Therefore, as in the case of the thermoelectric module using $Al_2O_3$ (aluminum oxide), AlN (aluminum nitride), SiC (silicon carbide), $Si_3N_4$ (silicon nitride), and the like for the material of a base material, the durability of thermoelectric module 10 can be improved without causing the substrate to generate thermal stress on thermoelectric element 1.

According to thermoelectric module 10 in the present embodiment, thermoelectric element 1 has one side configured as a heat-absorption side and the other side configured as a heat-dissipation side, in which electrode 2 is disposed on the heat-absorption side of thermoelectric element 1. Since electrode 2 is disposed on the heat-absorption side of thermoelectric element 1, concentration of thermal stress can be prevented on the heat-absorption side. Accordingly, the durability of thermoelectric module 10 can be effectively improved.

Second Embodiment

The configuration of a thermoelectric module in the second embodiment of the present invention will be hereinafter described. It is to be noted that the elements having the same functions as those in the first embodiment of the present invention are designated by the same reference characters, and the description thereof will not be repeated unless particularly needed.

Figure 8:
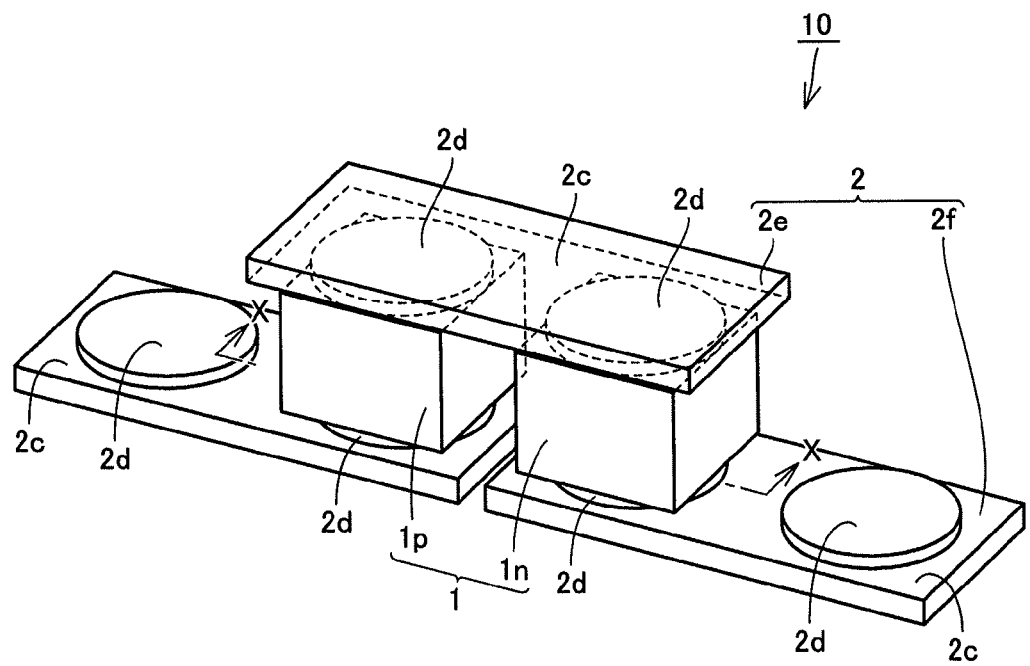
FIG. 8 is a perspective view schematically showing the configuration of a thermoelectric module in the second embodiment of the present invention.
Figure 9:
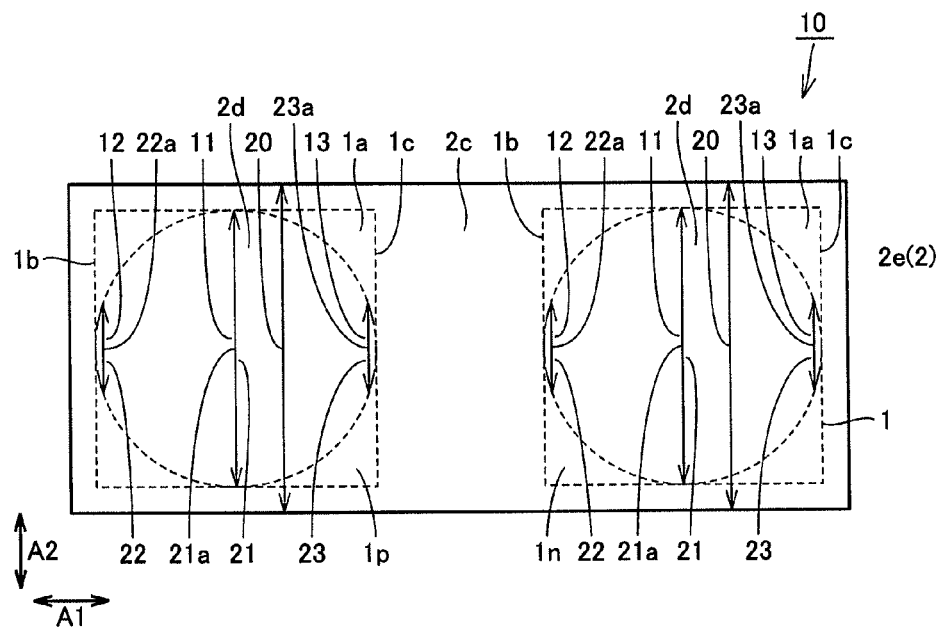
FIG. 9 is a top plan view schematically showing the configuration of one electrode and two thermoelectric elements joined to the electrode in the thermoelectric module in FIG. 8.

Referring to FIGS. 8 and 9, according to thermoelectric module 10 in the present embodiment, electrode 2 has a plate-shaped portion 2c and a protrusion 2d. Protrusion 2d is circular in plan view. Protrusion 2d is formed so as to protrude from plate-shaped portion 2c in the thickness direction of plate-shaped portion 2c. Specifically, electrode 2 is provided with a stepped portion such that there is a difference in height. Protrusion 2d is joined to end face 1a of thermoelectric element 1. In other words, thermoelectric element 1 is joined to the upper surface portion of the stepped portion of electrode 2. However, protrusion 2d is not joined to each of the four corners of end face 1a of thermoelectric element 1.

Figure 10:
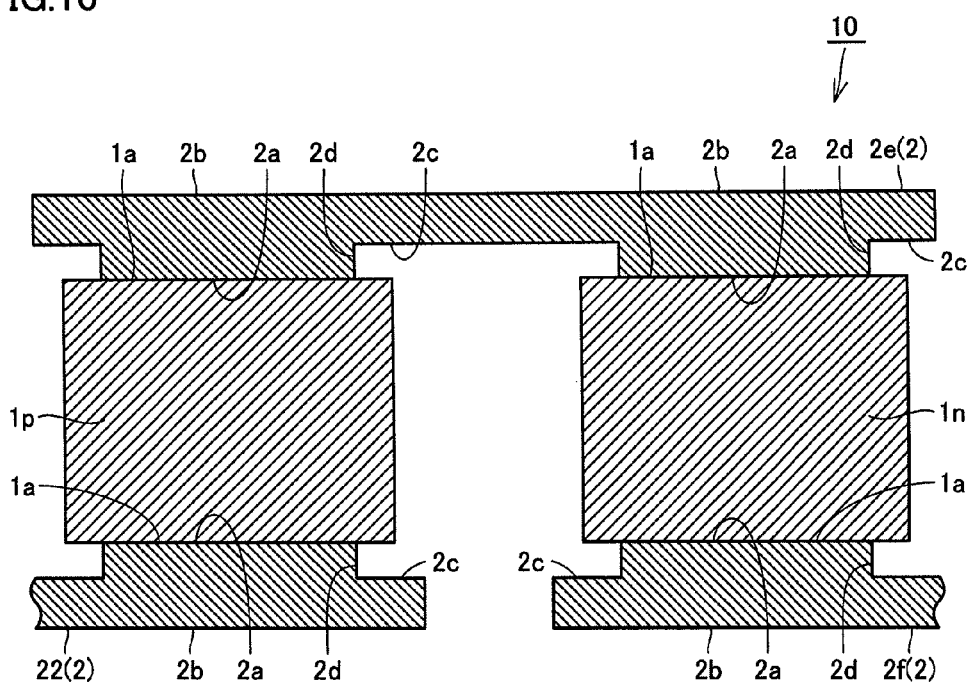
FIG. 10 is a schematic cross-sectional view taken along the line X-X in FIG. 8.

Referring to FIGS. 9 and 10, the outer circumferential edge of circular protrusion 2d is located so as to be aligned with the outer circumferential edge of rectangular end face 1a. Accordingly, each of second joint portion 22 and third joint portion 23 is arranged at a distance from each of the four corners of end face 1a.

Furthermore, first joint portion 21 has a length equal to the diameter of circular protrusion 2d. Each of second joint portion 22 and third joint portion 23 is equal in length to each end of circular protrusion 2d in first direction A1 in which opposite sides 1b and 1c of end face 1a face each other. Accordingly, joint length 21a is longer than each of joint length 22a and joint length 23a. Furthermore, length 20 of a portion including first joint portion 21 of electrode 2 in second direction A2 is equal to or longer than the length of end face 1a of thermoelectric element 1 in second direction A2.

Figure 11:
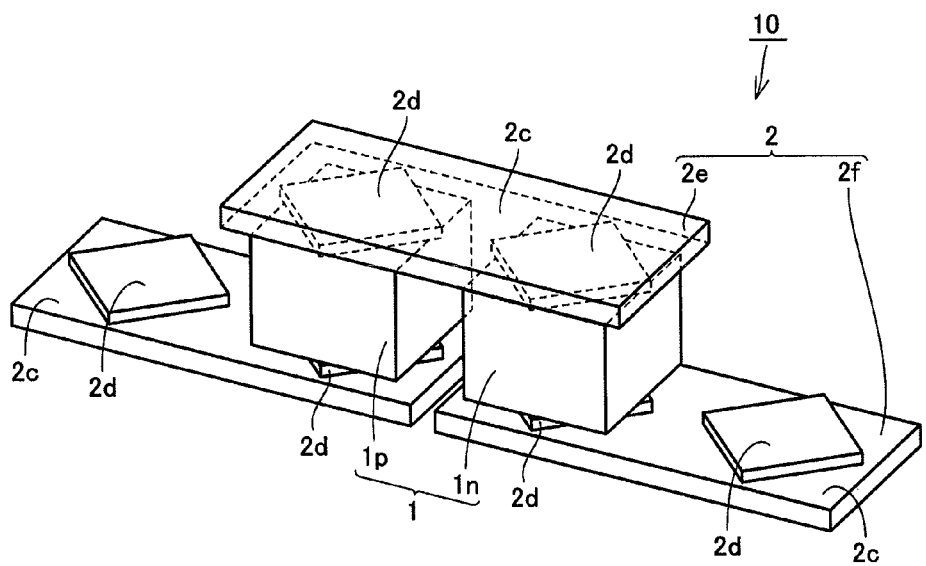
FIG. 11 is a perspective view schematically showing the configuration of a modification of the thermoelectric module in the second embodiment of the present invention.
Figure 12:
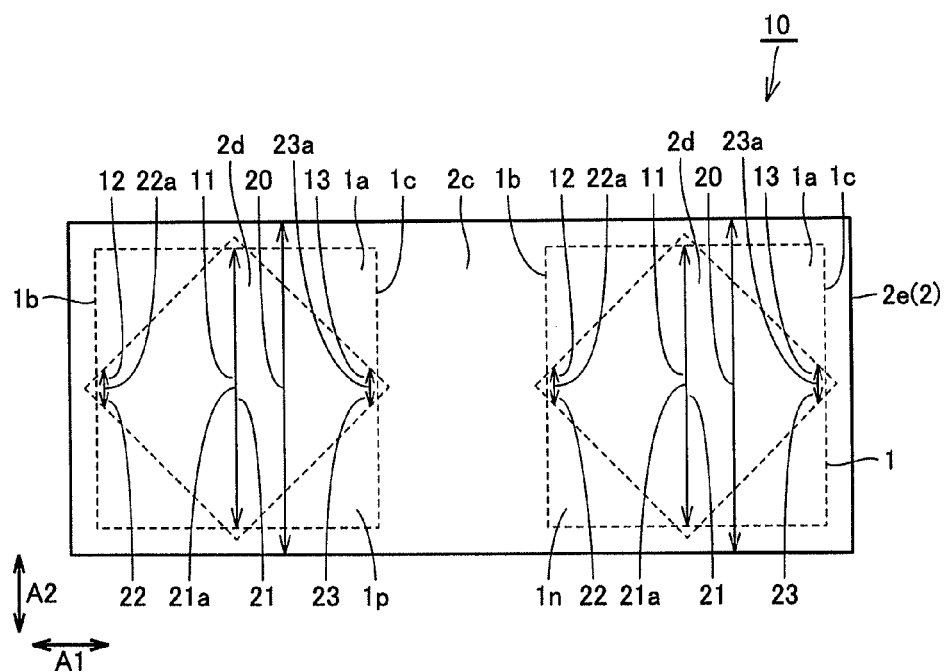
FIG. 12 is a top plan view schematically showing the configuration of one electrode and two thermoelectric elements joined to the electrode in the modification of the thermoelectric module in FIG. 11.

Then, referring to FIGS. 11 and 12, a modification of thermoelectric module 10 in the present embodiment will be hereinafter described. In the modification of thermoelectric module 10 in the present embodiment, protrusion 2d is formed as a rhombus in plan view. Rhombus-shaped protrusion 2d is located in such a position that it is rotated at approximately 45 degrees with respect to end face 1a in plan view. Four vertices of rhombus-shaped protrusion 2d each are located outside with respect to end face 1a. Specifically, as seen in first direction A1, the length of the diagonal line of rhombus-shaped protrusion 2d is longer than the length of end face 1. Also, as seen in second direction A2, the length of the diagonal line of rhombus-shaped protrusion 2d is longer than the length of end face 1.

Accordingly, each of second joint portion 22 and third joint portion 23 is disposed at a distance from each of the four corners of end face 1a. Furthermore, joint length 21a is longer than each of joint length 22a and joint length 23a. Furthermore, length 20 of a portion including first joint portion 21 of electrode 2 in second direction A2 is equal to or longer than the length of end face 1a of thermoelectric element 1 in second direction A2.

Although the above description is about the case where protrusion 2d has a circular shape or a rhombus shape, protrusion 2d can have any shape as long as protrusion 2d is not in contact with each of the four corners of end face 1a, that is, protrusion 2d is not joined to each of the four corners of end face 1a.

According to thermoelectric module 10 in the present embodiment, as in the first embodiment, electrode 2 is not joined to the four corners of end face 1a of thermoelectric element 1, so that concentration of thermal stress in the four corners of end face 1a of thermoelectric element 1 can be prevented. Furthermore, the area of electrode 2 joined to end face 1a of thermoelectric element 1 can be enlarged, as compared with the case where joint length 21a between first joint portion 21 and end face 1a is equal to each of joint length 22a between second joint portion 22 and end face 1a, and joint length 23a between third joint portion 23 and end face 1a.

Furthermore, according to thermoelectric module 10 in the present embodiment, protrusion 2d of electrode 2 is joined to end face 1a of thermoelectric element 1. Accordingly, the thermal stress generated in thermoelectric element 1 can be released to protrusion 2d of electrode 2. Also, even if the thermal stress is concentrated in protrusion 2d, the durability of thermoelectric module 10 can be improved because electrode 2 is greater in mechanical strength than thermoelectric element 1.

According to thermoelectric module 10 in the present embodiment, plate-shaped portion 2c and protrusion 2d of electrode 2 are integrally formed. Consequently, the mechanical strength of electrode 2 can be improved, thereby allowing further improvement in durability of thermoelectric module 10.

EXAMPLES

An example of the present invention will be hereinafter described.

In the present example, the durability test was first carried out using the thermoelectric module of the above-described first embodiment and a thermoelectric module of a comparative example. In the thermoelectric module of the comparative example, an electrode is joined to four corners of an end face of a thermoelectric element. The thermoelectric elements used in this example include a thermoelectric element having a height of 2.6 mm and a length and a width of 2.14 mm, and a thermoelectric element having a height of 2.6 mm and a length and a width of 1.73 mm.

In the durability test, the thermoelectric module was immersed in the fluorine-based inert fluid regulated at a temperature of 10° C. In this state, a current was caused to flow such that an electrode on one side (on the surface side) and an electrode on the other side (on the back surface side) alternately reached a relatively low temperature and a relatively high temperature, thereby repeating a cycle caused by temperature amplitude. The cycle time was 15 seconds, and a direct current of 12A was applied for 7.5 seconds in each of the forward direction and the backward direction. The electrode temperatures on the heating side and the cooling side after a lapse of 7.5 seconds were 120° C. and 15° C., respectively. Thus, there was a temperature difference of 105° C. between the heat-dissipation side electrode and the heat-absorption side electrode.

Destruction of the thermoelectric module was evaluated based on the change (increase) rate of the inner electrical resistance of the thermoelectric module obtained when this cycle was repeated. Specifically, the change rate of the inner electrical resistance of the thermoelectric module was measured, and it was evaluated that destruction occurred when the change rate reached 2%. Consequently, the thermoelectric module of the first embodiment required 20% or more cycles than that in the case of the thermoelectric module of the comparative example until the change rate reached 2%. Accordingly, it was recognized that the thermoelectric module of the first embodiment was improved in durability by 20% or more as compared with the thermoelectric module of the comparative example.

Furthermore, the thermoelectric module of the above-described first embodiment and the thermoelectric module of the comparative example were subjected to thermal stress analysis. In the thermoelectric module of the comparative example, an electrode is joined to the four corners of the end face of the thermoelectric element. Consequently, the maximum stress generated in the four corners of the thermoelectric element of the thermoelectric module in the present embodiment showed a value of about 60 percent of the maximum stress generated in the four corners of the thermoelectric element of the thermoelectric module in the comparative example. In other words, it was recognized in the thermoelectric module of the present embodiment that the four corners of the thermoelectric element undergoes stress relaxation that is about 40% of stress relaxation in the thermoelectric module of the comparative example.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A thermoelectric module comprising:
   a thermoelectric element having a rectangular end face; and
   an electrode joined to said end face to be electrically connected to said thermoelectric element,
   said electrode including
      a first joint portion joined to a center portion of said end face in a first direction in which opposite sides of said end face face each other, and
      a second joint portion joined to one end of said end face across said center portion in said first direction and a third joint portion joined to the other end of said end face,
   each of said second joint portion and said third joint portion being disposed at a distance from each of four corners of said end face, and
   a joint length in a second direction orthogonal to said first direction between said first joint portion and said end face being longer than each of a joint length in said second direction between said second joint portion and said end face, and a joint length in said second direction between said third joint portion and said end face.

2. The thermoelectric module according to claim 1, wherein a length of a portion including said first joint portion of said electrode in said second direction is equal to or longer than a length of said end face of said thermoelectric element in said second direction.

3. The thermoelectric module according to claim 1, wherein
   said electrode includes a plate-shaped portion and a protrusion protruding from said plate-shaped portion in a thickness direction of said plate-shaped portion, and said protrusion is joined to said end face of said thermoelectric element.

4. The thermoelectric module according to claim 3, wherein said plate-shaped portion and said protrusion of said electrode are integrally formed.

5. The thermoelectric module according to claim 1, further comprising a base film formed of polyimide and joined to said electrode, wherein said electrode includes one face and the other face facing each other, said one face is joined to said end face of said thermoelectric element, and said other face is joined to said base film.

6. The thermoelectric module according to claim 1, wherein said thermoelectric element has one side configured as a heat-absorption side and the other side configured as a heat-dissipation side, and said electrode is disposed on the heat-absorption side of said thermoelectric element.

* * * * *